United States Patent
Suh

(10) Patent No.: US 10,331,517 B2
(45) Date of Patent: Jun. 25, 2019

(54) LINK ERROR CORRECTION IN MEMORY SYSTEM

(71) Applicant: QUALCOMM Incorporated, San Diego, CA (US)

(72) Inventor: Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 5 days.

(21) Appl. No.: 15/643,455

(22) Filed: Jul. 6, 2017

(65) Prior Publication Data
US 2018/0060171 A1  Mar. 1, 2018

Related U.S. Application Data

(60) Provisional application No. 62/380,104, filed on Aug. 26, 2016.

(51) Int. Cl.
 *G06F 3/06* (2006.01)
 *H03M 13/31* (2006.01)
 *G06F 11/10* (2006.01)

(52) U.S. Cl.
 CPC .......... *G06F 11/1076* (2013.01); *G06F 3/064* (2013.01); *G06F 3/0619* (2013.01); *G06F 3/0673* (2013.01); *G06F 11/1048* (2013.01); *H03M 13/31* (2013.01)

(58) Field of Classification Search
 CPC ............. G06F 11/1076; G06F 11/1048; G06F 3/0673; G06F 3/0619; G06F 3/064; H03M 13/31
 See application file for complete search history.

(56) References Cited

U.S. PATENT DOCUMENTS

| | | | |
|---|---|---|---|
| 7,032,056 B2* | 4/2006 | Cochran | G06F 13/4273 370/912 |
| 2009/0327800 A1 | 12/2009 | Kim | |
| 2014/0177362 A1 | 6/2014 | O'Connor et al. | |
| 2014/0331101 A1* | 11/2014 | Chung | G06F 11/085 714/755 |
| 2017/0147432 A1* | 5/2017 | Suh | G06F 3/0619 |

(Continued)

OTHER PUBLICATIONS

JEDEC Standard: "Graphics Double Data Rate (GDDR5) SGRAM Standard," JESD212C, JEDEC Solid State Technology Association, Feb. 2016, 158 pages.

(Continued)

*Primary Examiner* — Cynthia Britt
(74) *Attorney, Agent, or Firm* — Muncy, Geissler, Olds & Lowe, P.C.

(57) ABSTRACT

Conventional link error correction techniques in memory subsystems include either widening the I/O width or increasing the burst length. However, both techniques have drawbacks. In one or more aspects, it is proposed to incorporate link error correction in both the host and the memory devices to address the drawbacks associated with the conventional techniques. The proposed memory subsystem is advantageous in that the interface architecture of conventional memory systems can be maintained. Also, the link error correction is capability is provided with the proposed memory subsystem without increasing the I/O width and without increasing the burst length.

17 Claims, 12 Drawing Sheets

(56) References Cited

U.S. PATENT DOCUMENTS

2018/0059976 A1* 3/2018 Helmick ............... G06F 3/0688

OTHER PUBLICATIONS

JEDEC Standard: "Low Power Double Data Rate 4 (LPDDR4)," JESD209-4A, JEDEC Solid State Technology Association, Nov. 2015, 272 pages.
International Search Report and Written Opinion—PCT/US2017/041129—ISA/EPO—Oct. 11, 2017.

* cited by examiner

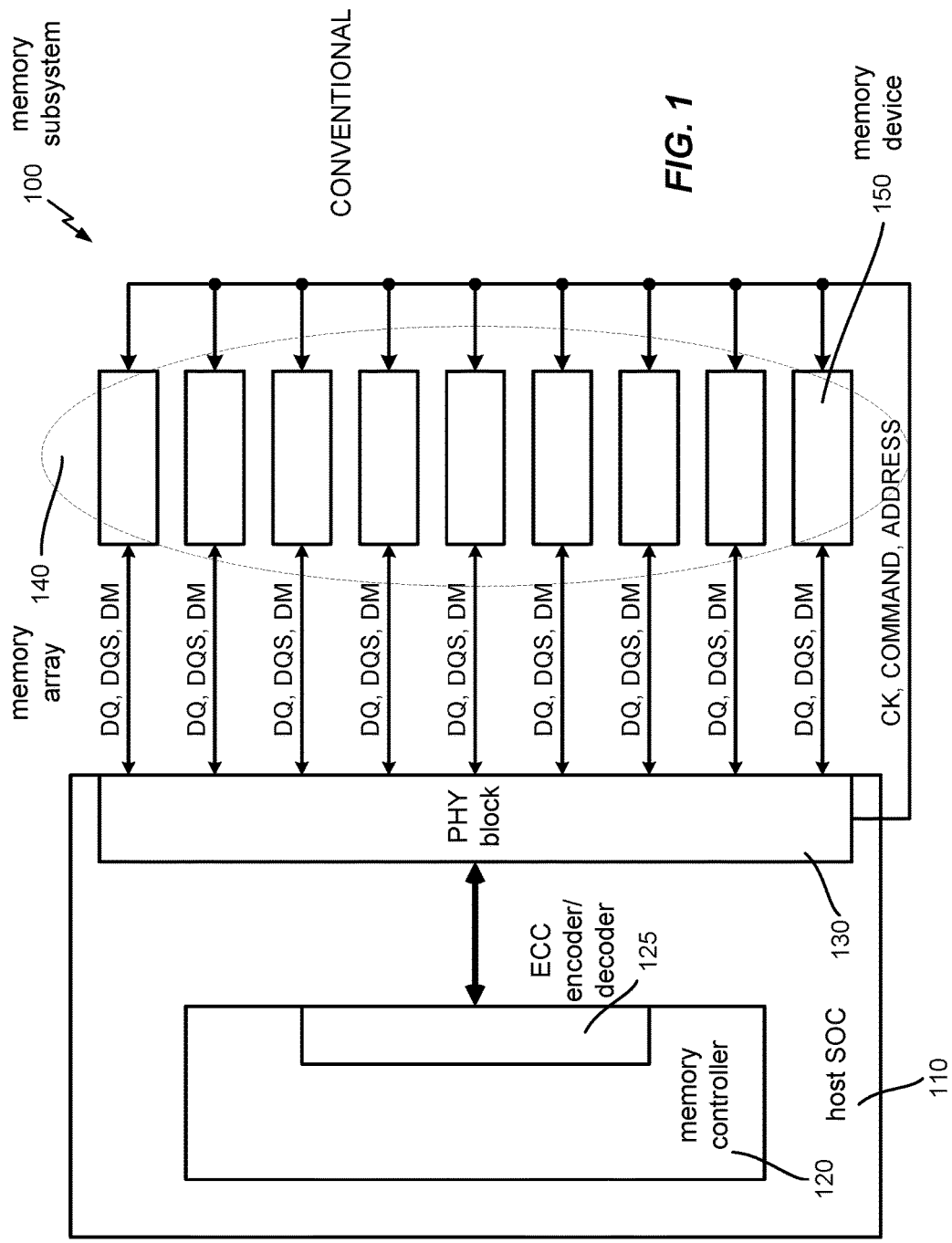
FIG. 1
CONVENTIONAL

| | | | | | | | | | | | | | | | | |
|---|---|---|---|---|---|---|---|---|---|---|---|---|---|---|---|---|
| DQ0 | d0 | d8 | d10 | d18 | d20 | d28 | d30 | d38 | d40 | d48 | d50 | d58 | d60 | d68 | d70 | d78 |
| DQ1 | d1 | d9 | d11 | d19 | d21 | d29 | d31 | d39 | d41 | d49 | d51 | d59 | d61 | d69 | d71 | d79 |
| DQ2 | d2 | dA | d12 | d1A | d22 | d2A | d32 | d3A | d42 | d4A | d52 | d5A | d62 | d6A | d72 | d7A |
| DQ3 | d3 | dB | d13 | d1B | d23 | d2B | d33 | d3B | d43 | d4B | d53 | d5B | d63 | d6B | d73 | d7B |
| DQ4 | d4 | dC | d14 | d1C | d24 | d2C | d34 | d3C | d44 | d4C | d54 | d5C | d64 | d6C | d74 | d7C |
| DQ5 | d5 | dD | d15 | d1D | d25 | d2D | d35 | d3D | d45 | d4D | d55 | d5D | d65 | d6D | d75 | d7D |
| DQ6 | d6 | dE | d16 | d1E | d26 | d2E | d36 | d3E | d46 | d4E | d56 | d5E | d66 | d6E | d76 | d7E |
| DQ7 | d7 | dF | d17 | d1F | d27 | d2F | d37 | d3F | d47 | d4F | d57 | d5F | d67 | d6F | d77 | d7F |
| DM | M0 | M1 | M2 | M3 | M4 | M5 | M6 | M7 | M8 | M9 | MA | MB | MC | MD | ME | MF |
| ECC | E0 | E1 | E2 | E3 | E4 | E5 | E6 | E7 | | | | | | | | |

Burst Length = 16

*FIG. 6A*

| | | | | | | | | | | | | | | | | |
|---|---|---|---|---|---|---|---|---|---|---|---|---|---|---|---|---|
| DQ0 | d0 | d8 | d10 | d18 | d20 | d28 | d30 | d38 | d40 | d48 | d50 | d58 | d60 | d68 | d70 | d78 |
| DQ1 | d1 | d9 | d11 | d19 | d21 | d29 | d31 | d39 | d41 | d49 | d51 | d59 | d61 | d69 | d71 | d79 |
| DQ2 | d2 | dA | d12 | d1A | d22 | d2A | d32 | d3A | d42 | d4A | d52 | d5A | d62 | d6A | d72 | d7A |
| DQ3 | d3 | dB | d13 | d1B | d23 | d2B | d33 | d3B | d43 | d4B | d53 | d5B | d63 | d6B | d73 | d7B |
| DQ4 | d4 | dC | d14 | d1C | d24 | d2C | d34 | d3C | d44 | d4C | d54 | d5C | d64 | d6C | d74 | d7C |
| DQ5 | d5 | dD | d15 | d1D | d25 | d2D | d35 | d3D | d45 | d4D | d55 | d5D | d65 | d6D | d75 | d7D |
| DQ6 | d6 | dE | d16 | d1E | d26 | d2E | d36 | d3E | d46 | d4E | d56 | d5E | d66 | d6E | d76 | d7E |
| DQ7 | d7 | dF | d17 | d1F | d27 | d2F | d37 | d3F | d47 | d4F | d57 | d5F | d67 | d6F | d77 | d7F |
| DM | M0 | M1 | M2 | M3 | M4 | M5 | M6 | M7 | M8 | M9 | MA | MB | MC | MD | ME | MF |
| ECC | E0 | E1 | E2 | E3 | E4 | E5 | E6 | E7 | E8 | E9 | EA | EB | EC | ED | EE |  |

Burst Length = 16

*FIG. 6B*

LINK ERROR CORRECTION IN MEMORY SYSTEM

CROSS-REFERENCE TO RELATED APPLICATIONS

The present application for patent claims the benefit of U.S. Provisional Application No. 62/380,104, entitled "LINK ERROR CORRECTION IN MEMORY SYSTEM", filed Aug. 26, 2016, assigned to the assignee hereof, and expressly incorporated herein by reference in its entirety.

FIELD OF DISCLOSURE

One or more aspects of the present disclosure generally relate to memory systems, and in particular, to link error corrections in memory systems.

BACKGROUND

There can be errors in data transfers between host and memory devices. These link errors may be detected and often corrected by incorporating error correction codes (ECC) in data transfers. Two techniques have been conventionally used to implement ECC. In the first conventional technique, the input/output (I/O) width is increased to accommodate both the data and the ECC. In the second conventional technique, the ECC bits are transferred between the host and the memory by extending the data burst length.

In the first conventional technique, conventional server and computing systems typically use 72-bit I/O width memory module (64-bit data and corresponding 8-bit ECC) to enhance reliability of memory link and memory cell array. FIG. 1 illustrates a simplified diagram of a conventional memory subsystem 100 which includes a host system-on-chip (SOC) 110 with a memory array 140. The host SOC 110 includes a memory controller 120 with an ECC encoder/decoder 125 and a PHY block 130. The memory array 140 includes nine 8-bit memory devices 150. An 8-bit ECC can be assigned to each 64-bit data to protect any bit error in both the host SOC 110 and the memory cell array 140. The data can be written to the first eight memory devices 150, and the ECC can be written to the 9$^{th}$ memory device 150.

As seen, the conventional memory configuration incurs additional memory devices cost. It also results in an increased printed circuit board (PCB) area cost by requiring wider memory channel routing and increased memory standby & active power cost due to the additional 9$^{th}$ memory device 150. The additional memory configuration directly impacts performance Memory bandwidth corresponds with how many valid bits are transferred per given amount of time. However, the additional ECC bits, while enhancing reliability, do not themselves have values as data. Thus, the first conventional technique directly impacts the performance of the memory subsystem in that the entire I/O width is not used to transfer useful data.

FIG. 2 illustrates a simplified diagram of the conventional memory subsystem 100, but this time showing only one data (DQ) byte for simplicity. The memory device 150 includes an I/O block 260 and a plurality of memory banks 270. As seen, signal lines, collectively referred to as a link 290, are used to exchange data between the host SOC 110 and the memory device 150. The link 290 includes:

DQ[0:7] lines: DQ byte bidirectional bus for transfer of data between memories and the SOC;
DM line: Data Mask for Write Data;
Data CK line: Clock input to strobe the Write Data;
Read Strobe CK line: Clock output to be aligned with Read Data timing (a clock input to the SOC);
CA[0:n] lines: Command & Address;
CA CK line: Command & Address clock input to fetch CA.

It should be noted that the DM line may be a Data Mask Inversion (DMI) pin function—either a Data Inversion or Data Mask. The DMI pin function depends on a Mode Register setting. However, in FIG. 2, it is shown as DM line for simplicity.

FIG. 3A illustrates a timing diagram of a conventional mask write operation. The memory controller 120 issues a WRITE command to the memory device 150. After some delay, a byte (8-bits) of data is transferred over each of sixteen burst cycles from the host SOC 110 to the memory device 150. In other words, a 128-bit Write Data (8-bit DQ×burst length 16) is transferred. In FIG. 3A, each of D0-DF represents 8-bits (a byte) of the Write Data DQ[0:7] being transferred in one burst cycle. The Write Data is transferred with some data mask (DM) activities. In this example, a 16-bit DM is used to mask each DQ byte. Conventionally, the Read Strobe clock line is idle since this is a write operation.

FIG. 3B illustrates a timing diagram of a conventional read operation. The memory controller 120 issues a READ command to the memory device 150. After some delay, the memory device 150 responds by sending a 128-bit Read Data (8-bit DQ×burst length 16) to the host SOC 110. Again, each of D0-DF represents a byte of the Read Data DQ[0:7] being transferred in one burst cycle. The Read Strobe clock from the memory device 150 toggles with the Read Data as an input clock to the host SOC 110. The DM line is idle since this is a read operation.

In the second conventional technique, burst lengths are extended to transmit the ECC codes. For example, the burst length can be extended from 16 to 18 (BL16→BL18), and the ECC bits can be transferred between the host SOC 110 and the memory device 150 in burst cycles not used to transfer the DQ bits. This conventional extended data burst length technique also directly impacts performance in that not every cycle is used to transfer useful data.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

An exemplary memory device is disclosed. The memory device may comprise a memory bank, a memory side interface, a memory side encoder, and a memory side decoder. The memory side interface may be configured to receive a WRITE command from a host over a link, receive Write Data and a write protection code from the host over the link, and store the Write Data to the memory bank in response to the WRITE command. The memory side interface may also be configured receive a READ command from the host over the link, retrieve Read Data from the memory bank in response to the READ command, and send the Read Data and a read protection code to the host over the link. The memory side decoder may be configured to detect whether the Write Data has an error based on the write protection code, and the memory side encoder may be configured to generate the read protection code based on the Read Data retrieved from the memory bank. The link may comprise a plurality of data lines, a data mask line, and a Read Strobe clock line. The data mask line may be used in mask write operations, and the Read Strobe clock line may be used by the memory device to provide timing in read operations. The memory side interface may further be configured to receive the Write Data and send the Read Data over the plurality of data lines, receive the write protection code over the Read Strobe clock line, and send the read protection code over the data mask line.

An exemplary host is disclosed. The host may comprise a memory controller, a host side interface, a host side encoder, and a host side decoder. The memory controller may be configured to issue READ and WRITE commands. The host side interface may be configured to send the WRITE command from the memory controller to the memory device over a link, and send Write Data and a write protection code to the memory device over the link. The host side interface may also be configured to send the READ command from the memory controller to the memory device over the link, receive Read Data and a read protection code from the memory device over the link subsequent to the READ command being sent, and provide the Read Data to the memory controller. The host side encoder may be configured to generate the write protection code based on the Write Data, and the host side decoder may be configured to detect whether the Read Data has an error based on the read protection code. The link may comprise a plurality of data lines, a data mask line, and a Read Strobe clock line. The data mask line may be used in mask write operations, and the Read Strobe clock line used by the memory device to provide timing in read operations. The host side interface may further be configured to send the Write Data and receive the Read Data over the plurality of data lines, send the write protection code over the Read Strobe clock line, and receive the read protection code over the data mask line.

An exemplary method is disclosed. The method may comprise a host sending a WRITE command to a memory device over a link, the host generating a write protection code based on Write Data, and the host sending the Write Data and the write protection code to the memory device over the link. The method may also comprise the memory device detecting whether the Write Data has an error based on the write protection code, and the memory device storing the Write Data to a memory bank of the memory device in response to the WRITE command. The link may comprise a plurality of data lines, a data mask line, and a Read Strobe clock line. The data mask line may be used in mask write operations, and the Read Strobe clock line for used the memory device to provide timing in read operations. The host may send the Write Data to the memory device over the plurality of data lines, and may send the write protection code to the memory device over the Read Strobe clock line.

Another exemplary method is disclosed. The method may comprise a host sending a READ command to a memory device over a link, the memory device retrieving Read Data from a memory bank of the memory device in response to the READ command, the memory device generating a read protection code based on the Read Data, and the memory device sending the Read Data and the read protection code to the host over the link. The method may also comprise the host detecting whether the Read Data has an error based on the read protection code. The link may comprise a plurality of data lines, a data mask line, and a Read Strobe clock line. The data mask line may be used in mask write operations, and the Read Strobe clock line used by the memory device to provide timing in read operations. The memory device may send the Read Data to the host over the plurality of data lines, and may send the read protection code to the host over the data mask line.

An exemplary apparatus is disclosed. The apparatus may comprise a host and a memory device configured to communicate with each other over a link. The link may comprise a plurality of data lines, a data mask line, and a Read Strobe clock line. The data mask line may be used in mask write operations, and the Read Strobe clock line used by the memory device to provide timing in read operations. The memory device may be configured to receive a READ command from the host over the link, retrieve Read Data from a memory bank of the memory device in response to the READ command, generate a read protection code based on the Read Data, send the Read Data to the host over the plurality of data lines, and send the read protection code to the host over the data mask line. The read protection code may be a parity code for protection of the Read Data. The host may be configured to send the READ command to the memory device over the link, receive the Read Data from the memory device over the plurality of data lines, receive the read protection code from the memory device over the data mask line, and detect whether the Read Data has an error based on the read protection code.

An exemplary apparatus is disclosed. The apparatus may comprise a host and a memory device configured to communicate with each other over a link. The link may comprise a plurality of data lines, a data mask line, and a Read Strobe clock line. The data mask line may be used in mask write operations, and the Read Strobe clock line used by the memory device to provide timing in read operations. The host may be configured to send a WRITE command to the memory device over the link, generate a write protection code based on Write Data, send the Write Data to the memory device over the plurality of data lines, and send the write protection code to the memory device over the Read Strobe clock line. The write protection code may be a parity code for protection of the Write Data. The memory device may be configured to receive the WRITE command from the host over the link, receive the Write Data from the host over the plurality of data lines, receive the write protection code from the host over the Read Strobe clock line, and detect whether the Write Data has an error based on the write protection code.

BRIEF DESCRIPTION OF THE DRAWINGS

The accompanying drawings are presented to aid in the description of examples of one or more aspects of the disclosed subject matter and are provided solely for illustration of the examples and not limitation thereof:

FIG. 1 illustrates a diagram of a conventional memory subsystem with an additional memory device for error correction codes handling;

FIGS. 6A and 6B illustrate examples of data and corresponding protection codes;

DETAILED DESCRIPTION

Figure 2:
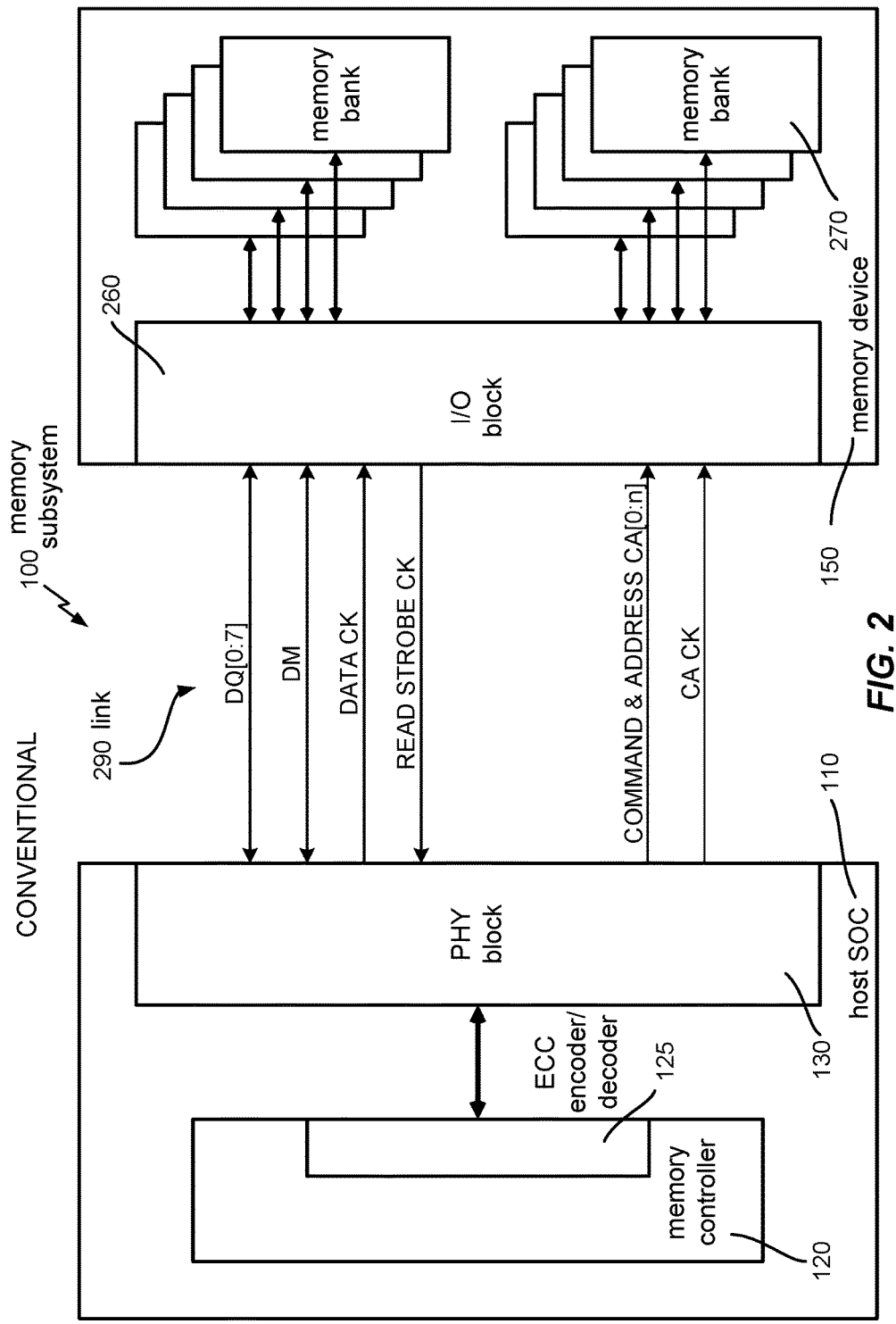
FIG. 2 illustrates a diagram of a conventional memory subsystem with signals exchanged between a host and a memory device.

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

One or more aspects of the disclosure may be applied to low power memory subsystem in mobile or computing systems to protect high speed memory links (interfaces) with error detection and/or correction codes. For example, one or more aspects may be related with next generation low power DDR SPEC and DDR PHY in mobile or computing chipsets.

In one or more aspects, it is proposed to incorporate encoding and decoding capabilities (e.g., ECC capabilities) in both the host and the memory devices. By incorporating such capabilities into the memory device as well as into the host, some or all issues associated with the conventional techniques may be addressed. First, the proposed technique does not require an additional memory device. This means that costs of additional devices is avoided, which in turns leads to less die area being consumed and less power being required. Therefore, more memory can be devoted storing useful data in the same die area. Second, the burst length need not be lengthened, i.e., each burst cycle may be used to transfer data. This means that performance penalty of dedicating some burst cycles to the transfer of ECC is also avoided. Third, no changes to the link between the host and the memory device are required.

Figure 4:
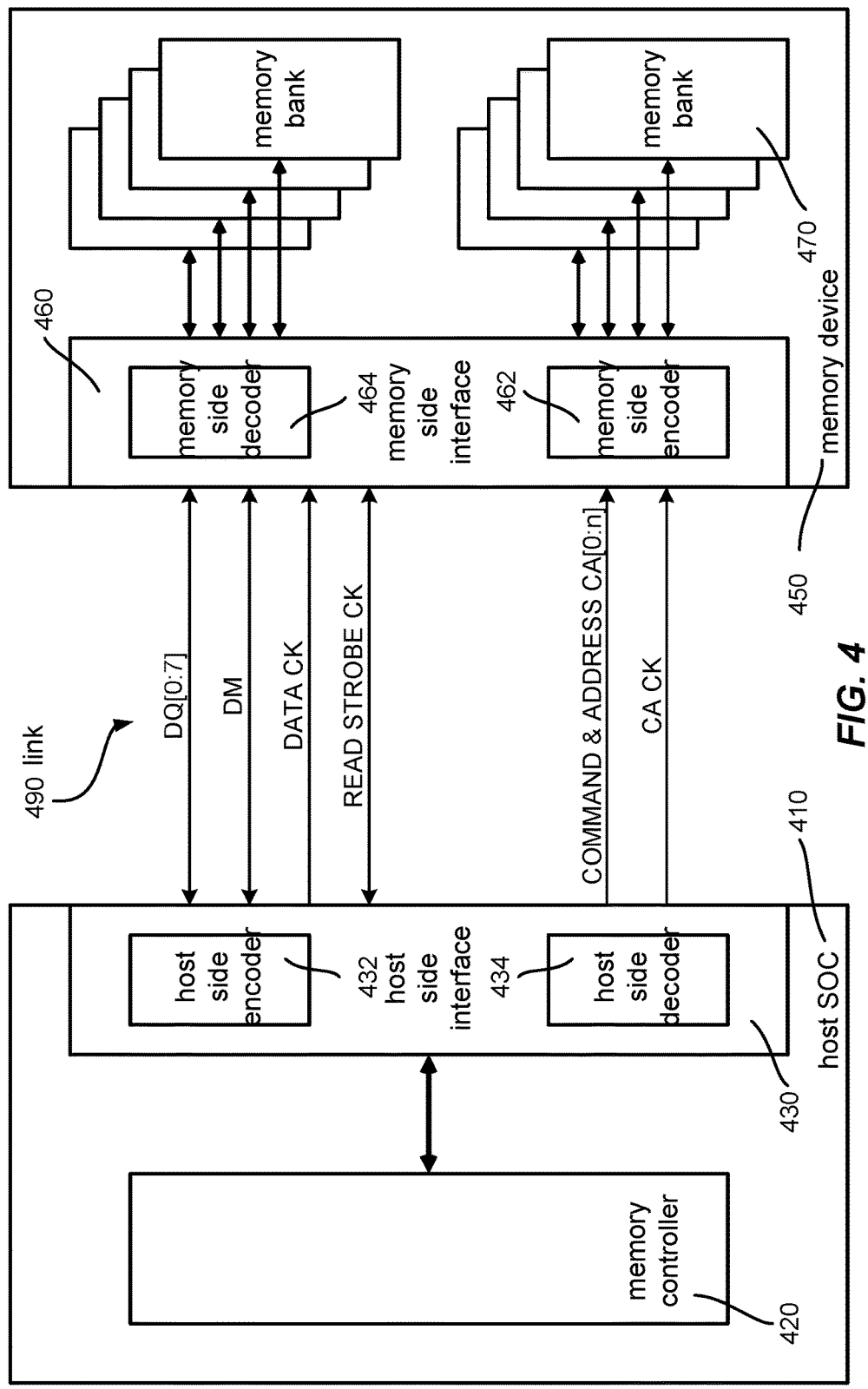
FIG. 4 illustrates a diagram of an example memory subsystem with signals exchanged between a host and a memory device.

FIG. 4 illustrates an example of a proposed memory subsystem 400 that includes a host 410 and a memory device 450. This is a simplified illustration in that a single memory device 450 for one data (DQ) byte is shown. However, a single host 410 may communicate with any number of memory devices 450. The host 410 (e.g., a system-on-chip SOC) may include a memory controller 420, a host side interface 430 (e.g., memory PHY block), a host side encoder 432, and a host side decoder 434.

The memory controller 420 may issue READ and WRITE commands to the memory device 450 through the host side interface 430. When the WRITE command is issued, the memory controller 420 may also provide Write Data to the host side interface 430. When the READ command is issued, the memory controller 420 may receive Read Data from the host side interface 430.

During a write operation, the host side interface 430 may send the WRITE command and the Write Data to the memory device 450 over a link 490. The host side encoder 432 (e.g., an ECC encoder) may generate a write protection code based on the Write Data, and the host side interface 430 may also send the write protection code to the memory device 450 over the link 490. The write protection code may be an ECC and/or other types of parity code to protect the Write Data. That is to say, the write protection code may allow the memory device 450 to detect and even correct errors that may be present in the Write Data. For example, an error may occur in the transmission of the Write Data from the host 410 to the memory device 450.

In another aspect, the host side encoder 432 may generate the write protection code based on the Write Data and the data mask (DM) data. In this way, the write protection code may protect the data mask (DM) bits in addition to protecting the Write Data. In this aspect, if the write operation does not involve masking, then the write protection code may be generated with the DM bits all zeroed out.

During a read operation, the host side interface 430 may send the READ command to the memory device 450 over the link 490. Subsequently, the host side interface 430 may receive the Read Data from the memory device 450 over the link 490, and provide the received Read Data to the memory controller 420.

The host side interface 430 may also receive a read protection code from the memory device 450 over the link 490 along with the Read Data. The read protection code may be an ECC and/or other types of parity code to that can be used to protect the Read Data. The host side decoder 434 may determine whether the received Read Data is valid based on the read protection code. In other words, the host side decoder 434 may detect whether the Read Data has an error. Additionally, the host side decoder 434 may correct the Read Data when the error is detected, and the host side interface 430 can provide the corrected Read Data to the memory controller 420.

In FIG. 4, the host side encoder 432 and the host side decoder 434 are illustrated as being incorporated into the host side interface 430. This is merely an example, and should not be taken to be limiting. It is contemplated that the host side encoder 432 and/or the host side decoder 434 may be on their own or incorporated into other components within the host 410 such as the memory controller 420. Also, while the host side encoder 432 and the host side decoder 434 are individually illustrated, the two may be implemented in a single device. It is also contemplated that the host side encoder 432 and/or the host side decoder 434 may be implemented in multiple devices. Indeed, in some aspect(s), the implementation of the host side encoder 432 and/or the host side decoder 434 may be spread among multiple components.

The memory device 450 may include a memory side interface 460 (e.g., an input/output (I/O) block), memory banks 470, a memory side encoder 462, and a memory side decoder 464. During the write operation, the memory side interface 460 may receive the WRITE command from the host 410 over the link 490. The memory side interface 460 may receive the Write Data from the host 410 over the link 490, and may store the Write Data in the memory banks 470 in response to the WRITE command.

The memory side interface 460 may also receive the write protection code from the host 410 over the link 490 along with the Write Data. As mentioned, the write protection code may be an ECC and/or other types of parity code. The memory side decoder 464 may determine whether the received Write Data is valid based on the write protection code. That is, the memory side decoder 464 may detect whether there are errors in the Write Data. Additionally, the memory side decoder 464 may correct the Write Data when the error is detected, and the memory side interface 460 can store the corrected Write Data in the memory banks 470.

Recall that in the proposed technique, no additional memory device is required. Unlike the conventional memory system illustrated in FIG. 1 which has the $9^{th}$ memory device 150 to store the ECC, it is NOT required to store the write protection code in any of the memory devices 450 in the proposed technique. Instead, all of the memory devices 450 may store useful data in an aspect.

During the read operation, the memory side interface 460 may receive the READ command from the host 410 over the link 490. In response to the READ command, the memory side interface 460 may retrieve the Read Data from the memory banks 470 and send the retrieved Read Data to the host 410 over the link 490.

The memory side encoder 462 may generate the read protection code based on the Read Data retrieved from the memory banks 470. Alternatively, the memory side encoder 462 may generate the read protection code based on the Read Data as well as on DM data, which may be zeroed out. As mentioned, the read protection code may be an ECC and/or other types of parity code. The memory side interface 460 may provide the read protection code along with the Read Data to the host 410 over the link.

In FIG. 4, the memory side encoder 462 and the memory side decoder 464 are illustrated as being incorporated into the memory side interface 460. This is merely an example, and should not be taken to be limiting. It is contemplated that the memory side encoder 462 and/or the memory side decoder 464 may be on their own or incorporated into other components within the memory device 450. Also, while the memory side encoder 462 and the memory side decoder 464 are individually illustrated, the two may be implemented in a single device. It is also contemplated that the memory side encoder 462 and/or the memory side decoder 464 may be implemented in multiple devices. Indeed, in some aspect(s), the implementation of the memory side encoder 462 and/or the memory side decoder 464 may be spread among multiple components.

In an aspect, the host side encoder 432 and the memory side encoder 462 may operate to generate identical write protection code and read protection code (e.g., same ECC) when provided with identical data. In another aspect, it is also possible that the write protection code can be different from the read protection code. However, as long as the memory and host side decoders 464, 434 respectively operate complimentarily to the host and memory side encoders 432, 462, proper data exchange can take place.

When the proposed memory subsystem 400 of FIG. 4 and the conventional memory subsystem 100 of FIG. 2 are compared, it is seen that the links 490 and 290 can be identical, i.e., there need not be any change in the configuration of the link 490 between the host 410 and the memory device 450. That is, the same signal lines DQ[0:7], DM, Data CK, Read Strobe CK, CA[0:n] and CA CK may be used to exchange information between the host 410 and the memory device 450. Since the same signal lines can be used, no architectural changes to the link 490 are required.

Figure 3A:
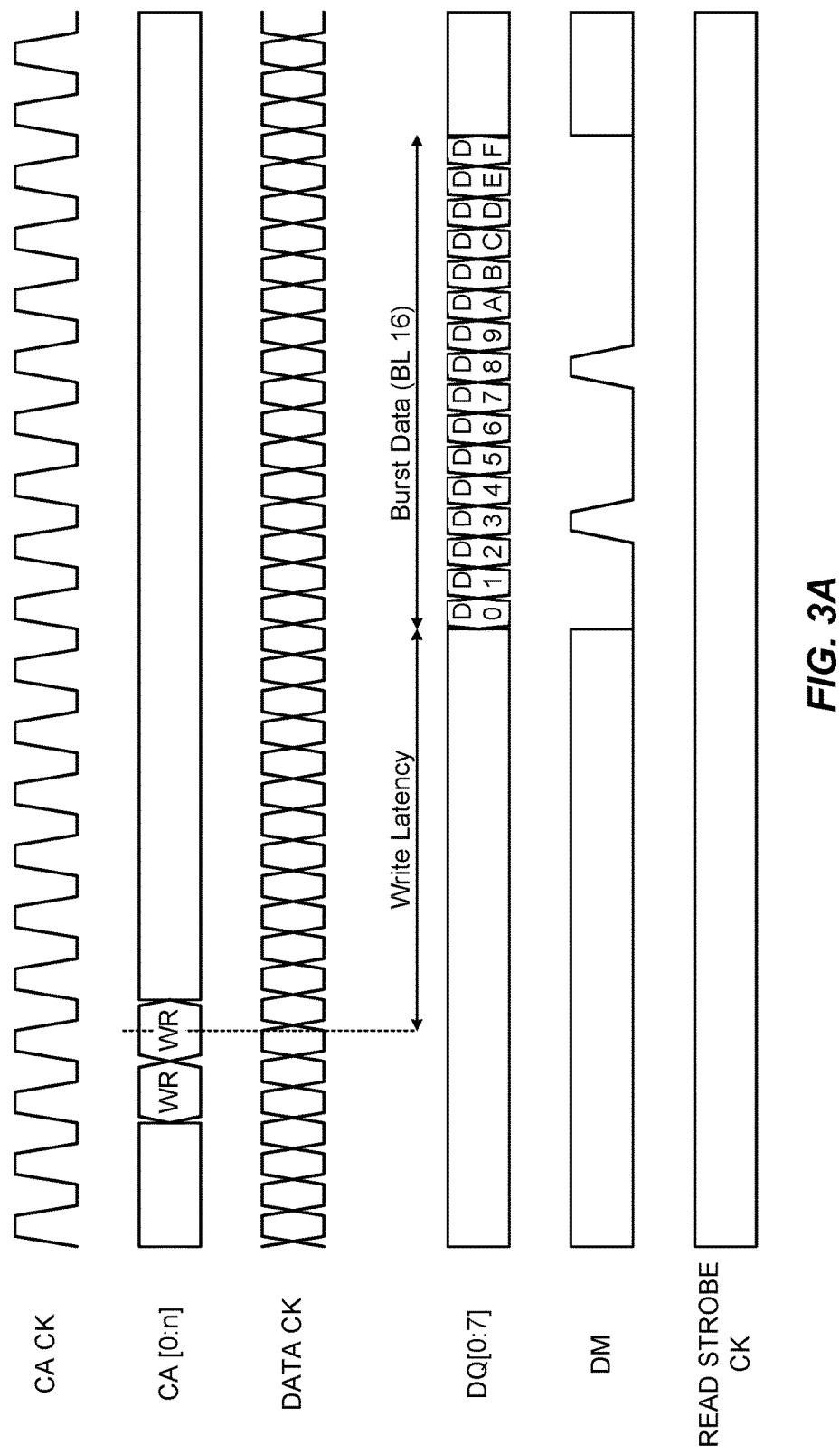
FIG. 3A illustrates a timing diagram of a write operation in a conventional memory subsystem.
Figure 3B:
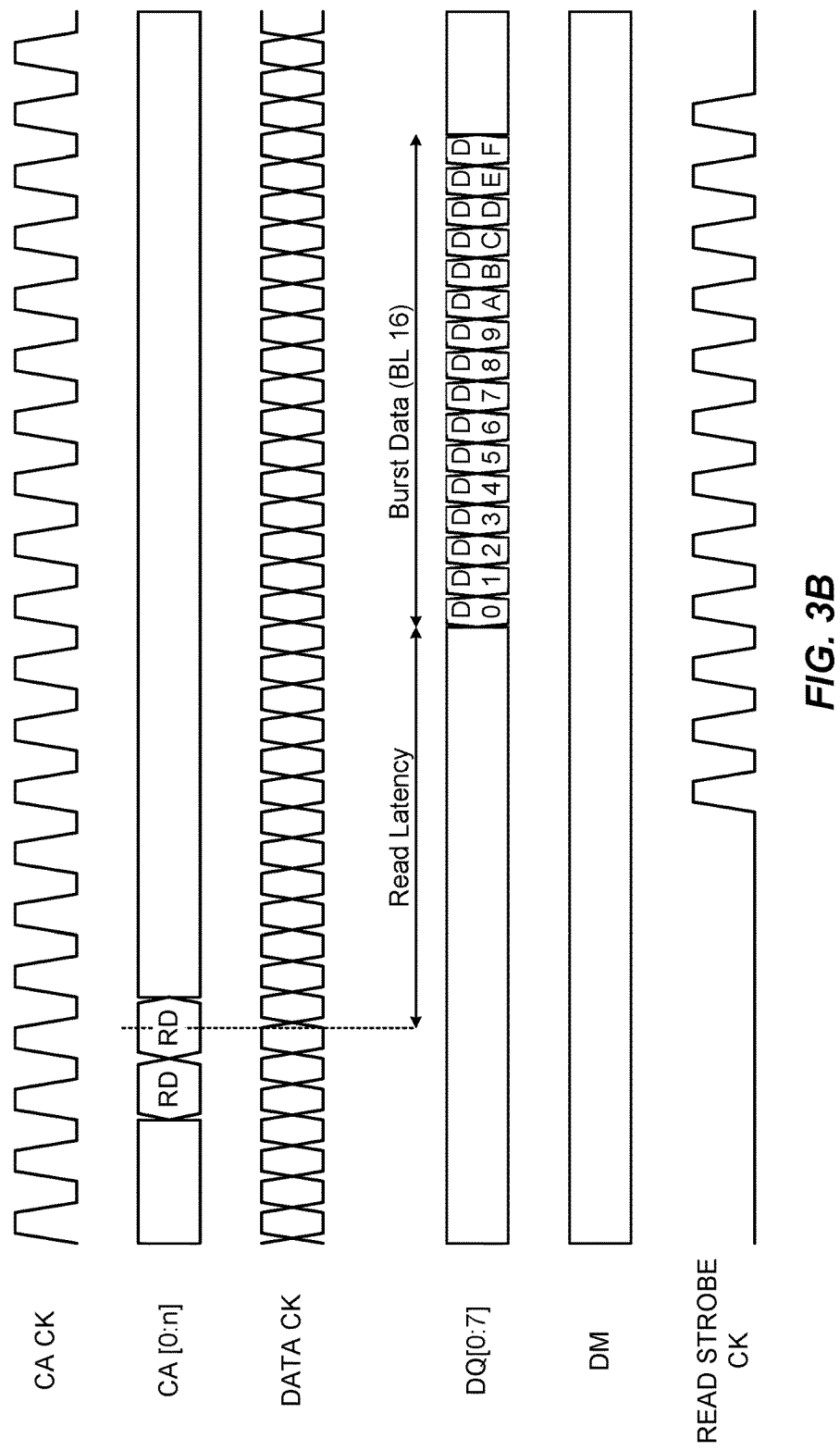
FIG. 3B illustrates a timing diagram of a read operation in a conventional memory subsystem.

It is desired that the write and read protection codes still be communicated between the host 410 and the memory device 450 without changing the link architecture, without increasing the I/O width, and without increasing the burst length. Recall that in the conventional memory system, the Read Strobe clock line remains idle during the write operation (see FIG. 3A) and the DM line remains idle during the read operation (see FIG. 3B). Therefore, in an aspect, it is proposed to utilize the Read Strobe clock line to transfer the write protection code during the write operation, and to utilize the DM line to transfer the read protection code during the read operation. By utilizing the Read Strobe clock line and the DM line, no additional signal lines are required to transfer the write and read protection codes between the host 410 and the memory device 450. The Read Data and Write Data may still be transferred over the data (DQ) lines.

Figure 5A:
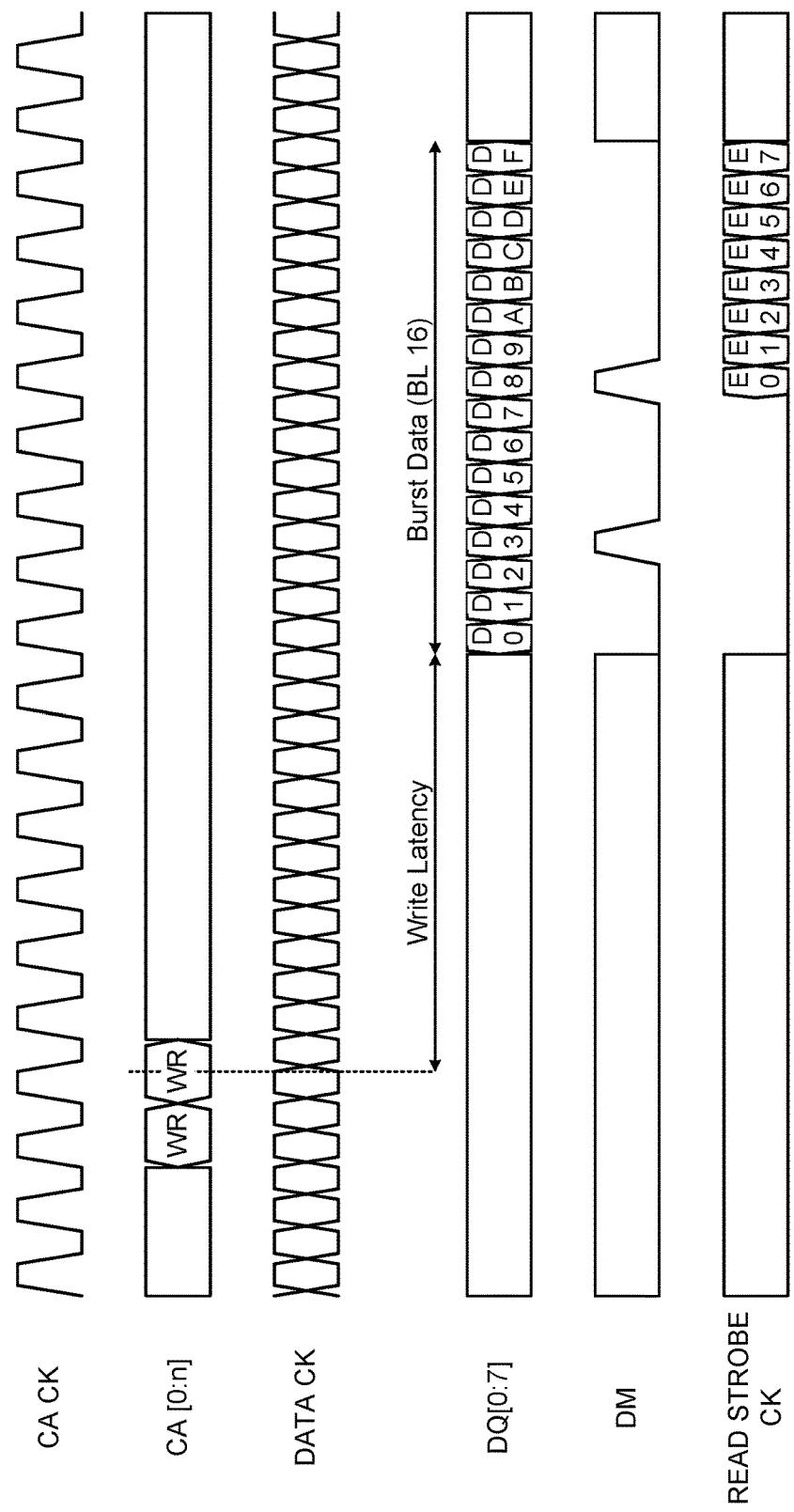
FIG. 5A illustrates a timing diagram of a write operation in an example memory subsystem.

FIG. 5A illustrates a timing diagram of an example of a mask write operation. In this example diagram, a 128-bit Write Data (8-bit DQ×burst length 16) may be assumed to be transferred over the DQ lines from the host 410 to the memory device 450. Each of D0-DF may represent 8-bits (a byte) of the Write Data DQ[0:7] being transferred in one burst cycle. In this example, the Write Data is assumed to be transferred with some data mask (DM) activities. For example, a 16-bit DM may be used to mask the DQ bytes of the Write Data. For example, $4^{th}$ and $9^{th}$ DM bits (M3 and M8) may be set to mask the $4^{th}$ and $9^{th}$ DQ bytes (D3 and D8). Note that for a normal write operation without masking, all DM bits would be unset, i.e., zeroed out.

The host side encoder 432 may generate the write protection code (e.g., an 8-bit ECC), which then may be transferred on the Read Strobe clock line by the host side interface 430. The host side encoder 432 may generate the write protection code based on the Write Data received from the memory controller 420. For example, an 8-bit write protection code may be generated to protect the 128-bit Write Data. In another aspect, the host side encoder 432 may generate the write protection code based on the DM bits in addition to the Write Data. For example, the 8-bit ECC may be generated to protect a total of 144 bits (the 128-bit Write Data and the 16-bit DM).

Thus, in a normal write operation (no masking), the write protection code may be based only on the 128-bit Write Data. Alternatively in the normal write operation, the write protection code may be based on the 128-bit Write Data and zeroed-out DM bits. In a mask write operation, if the protection of the DM data is not of concern, then the write protection code may be based only on the Write Data. Otherwise in the mask write operation, the write protection code may be based on the Write Data and the DM data.

As seen in FIG. 5A, the 8-bit E[0:7] write protection code may be transmitted to coincide with burst cycles 8 through 15. More generally, the write protection code may be transmitted during a latter part of the burst cycles such that an end of the burst cycles (e.g., burst cycle 15) coincides with the transmission of the last bit (e.g., E7) of the write protection code. This is because the write protection code may take some time to generate. By transferring the write protection code during the latter part of the burst cycles such that an end of the Read Data transfer coincides with an end of the read protection code transfer, maximum amount of time can be provided to generate the write protection data without having to extend the burst length.

Of course, the transfer of the write protection code can begin as soon as the individual write protection code bits are available. Thus, the transfer of the write protection code can finish before the end of the burst cycles. But regardless, it is generally preferred that the transfer of the write protection code finish no later than the end of the burst cycles to avoid lengthening of the burst length.

Figure 5B:
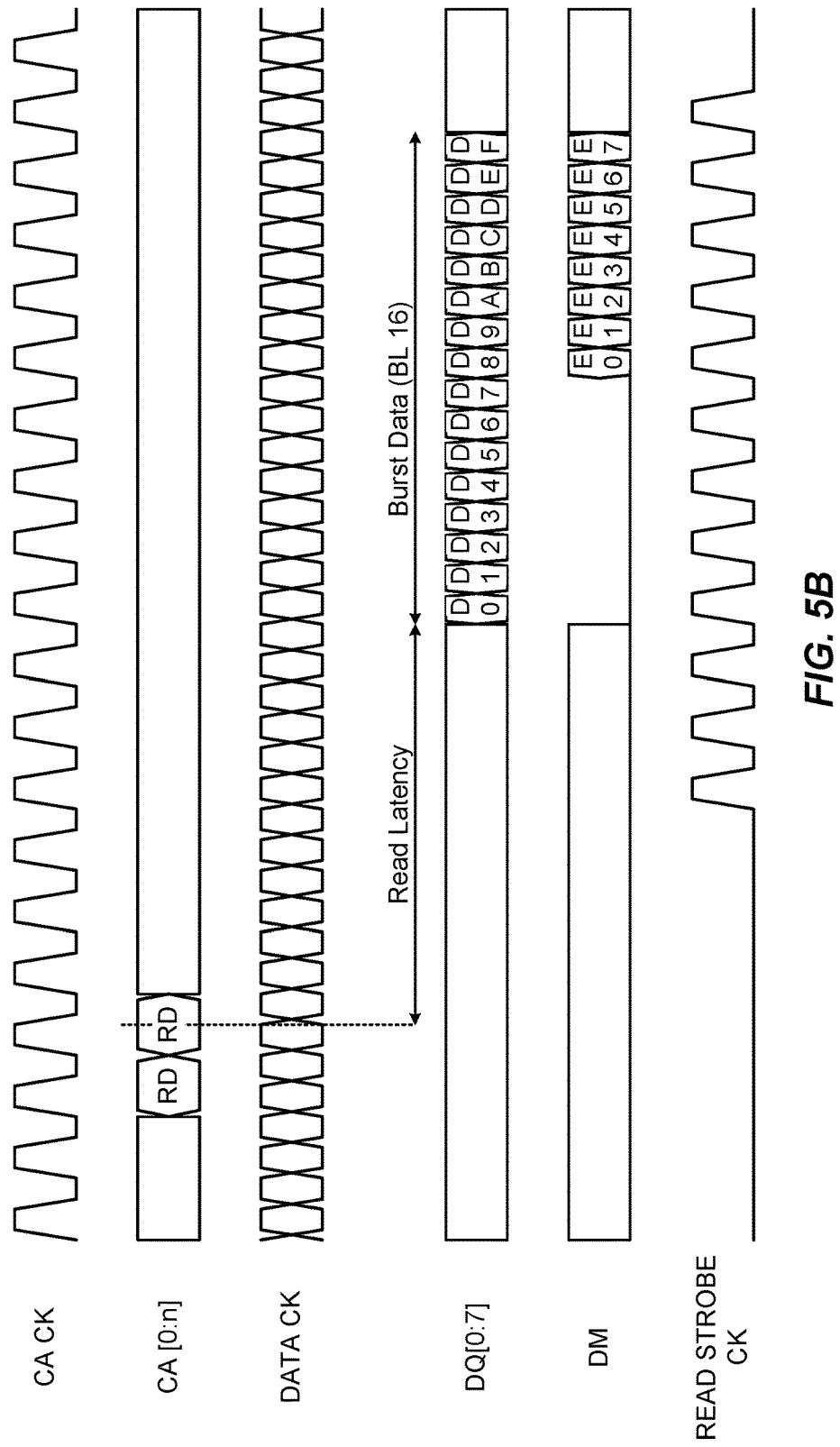
FIG. 5B illustrates a timing diagram of a read operation in an example memory subsystem.

FIG. 5B illustrates a timing diagram of an example of a read operation. As the memory controller 420 issues the READ command to the memory device 450, the memory device 450 may respond by sending the Read Data to the host 410. In this example diagram, a 128-bit Read Data (8-bit DQ×burst length 16) may be assumed to be transferred from the memory device 450 to the host 410 over the DQ lines. Each of D0-DF may represent 8-bits (a byte) of the Read Data DQ[0:7] being transferred in one burst cycle.

The memory side encoder 462 may generate the read protection code (e.g., an 8-bit ECC), which then may be transferred through the DM line by the memory side interface 460. The memory side encoder 462 may generate the read protection code based on the Read Data retrieved from the memory banks 470. For example, the 8-bit read protection code may be generated to protect the 128-bit Read Data. In another aspect, the read protection code may be generated to protect a total of 144 bits (the 128-bit Write Data and the 16-bit DM zeroed out).

The 8-bit E[0:7] read protection code may be transferred to coincide with burst cycles 8 through 15. More generally, the read protection code may be transferred during a latter part of the burst cycles such that an end of the burst cycles (e.g., burst cycle 15) coincides with the last bit (e.g., E7) of the read protection code. By transferring the read protection code during the latter part of the burst cycles such that an end of the Read Data transfer coincides with an end of the read protection code transfer, maximum time can be provided to generate the read protection data without having to extend the burst length.

The transfer of the read protection code can begin as soon as the individual read protection code bits are generated. Thus, the transfer of the read protection code can finish before the end of the burst cycles. But regardless, it is generally preferred that the transfer of the read protection code finish no later than the end of the burst cycles to avoid lengthening of the burst length.

FIG. 6A illustrates an example of data (e.g., Read/Write Data) and corresponding protection code (e.g., read/write protection code). In this example, it may be assumed that the 8-bit protection code (E0-E7) (e.g., ECC bits) is used to protect a 144-bit data (128-bit Read/Write Data (d0-d7F)+ 16-bit DM data (M0-MF)). As mentioned, the DM bits may all be zeroed for normal read/write operations. This is merely an example. Any number of data bits (e.g., any combination of Read/Write Data bits and masking bits) may be protected with the protection code.

The number of bits for the protection code can also be varied depending on the level of protection (e.g., error detection and correction) desired. FIG. 6B illustrates another example of data, DM data, and corresponding protection code. In this example, 9 ECC bits may be to protect the 128-bit data (e.g., Read/Write Data) and 6 ECC bits may be to protect the 16-bit DM data. Thus, in this example, a 15-bit ECC (E0-EE) code may be transferred.

Figure 7:
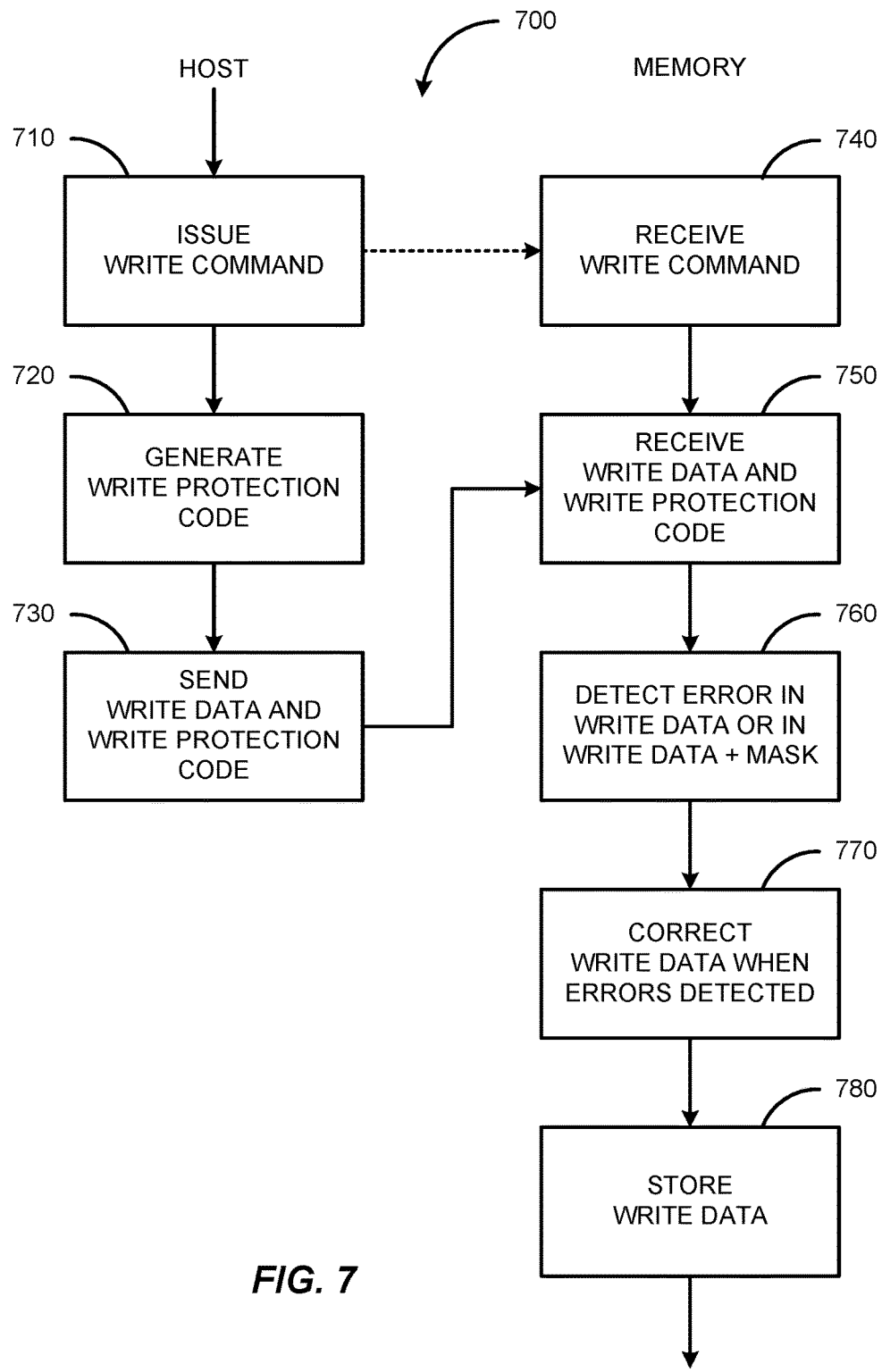
FIG. 7 illustrates a flow chart of an example method to perform a write operation.

FIG. 7 illustrates a flow chart of an example method 700 to perform a write operation. The method 700 may be applied to mask writes and/or to normal writes. In this figure, the host 410 may perform blocks 710-730 and the memory device 450 may perform blocks 740-780. On the host side, in block 710, the memory controller 420 may issue the WRITE command to the memory side through the host side interface 430. In block 720, the host side encoder 432 may generate the write protection code based on the Write Data provided by the memory controller 420. Alternatively, the host side encoder 432 may generate the write protection code to protect the Write Data and the DM data. In block 730, the host side interface 430 may send the Write Data and the write protection code (e.g., ECC) to the memory side. The Write Data may be sent over the DQ lines, and the write protection code may be sent over the Read Strobe clock line.

On the memory side, in block 740, the memory side interface 460 may receive the WRITE command from the host side. Thereafter, in block 750, the memory side interface 460 may receive the Write Data (e.g., over the DQ lines) and the write protection code (e.g., over the Read Strobe clock line) from the host side. In block 760, the memory side decoder 464 may detect whether there is an error in the Write Data based on the write protection code. Alternatively, the memory side decoder 464 may detect whether there is an error in the Write Data and/or the DM data based on the write protection code. In block 770, the memory side decoder 464 may correct the Write Data as needed, e.g., when any bit error(s) is(are) detected. In block 780, the memory side interface 460 may store the Write Data in the memory banks 470. If the memory side decoder 464 corrects the Write Data, the corrected Write Data may be stored in the memory banks 470.

Figure 8:
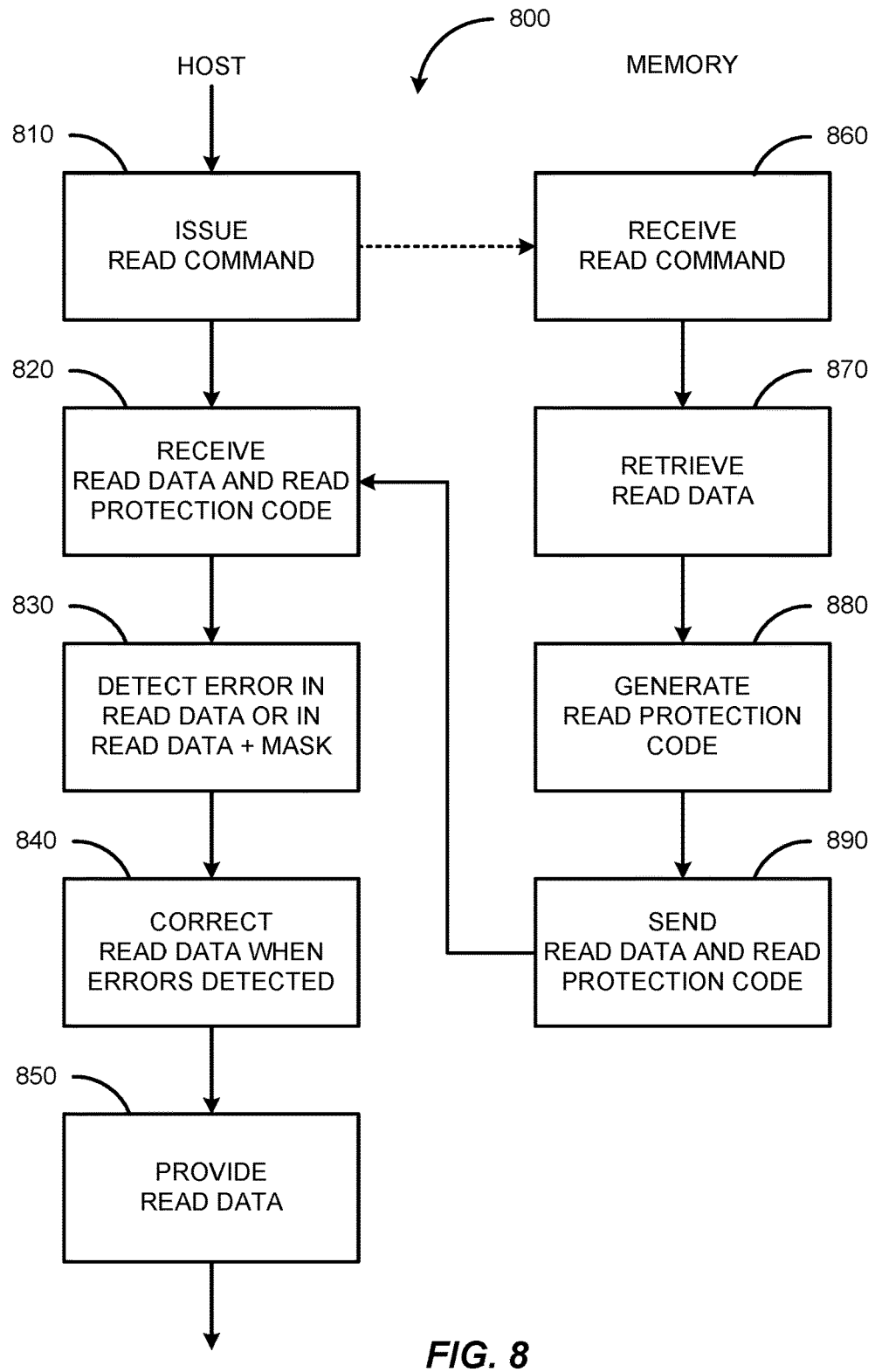
FIG. 8 illustrates a flow chart of an example method to perform a read operation.

FIG. 8 illustrates a flow chart of an example method 800 to perform a read operation. In this figure, the host 410 may perform blocks 810-850, and the memory device 450 may perform blocks 850-890. On the memory side, in block 860, the memory side interface 460 may receive the READ command from the host side. In block 870, memory side interface 460 may retrieve the Read Data from the memory banks 470. In block 880, the memory side encoder 462 may generate the read protection code based on the retrieved Read Data. Alternatively, the memory side encoder 462 may generate the read protection code to protect the Read Data and the DM data, and the DM data may be zeroed out. In block 890, the memory side interface 460 may send the Read Data and the read protection code (e.g., ECC) to the host side. The Read Data may be sent over the DQ lines, and the read protection code may be sent over the DM line.

On the host side, in block 810, the memory controller 420 may issue the READ command to the memory side through the host side interface 430. Thereafter, in block 820, the host side interface 430 may receive the Read Data (e.g., over the DQ lines) and the read protection code (e.g., over the DM line) from the memory side. In block 830, the host side decoder 434 may detect whether there is an error in the Read Data based on the read protection code. Alternatively, the host side decoder 434 may detect whether there is an error in the Read Data and/or the DM data based on the read protection code. In block 840, the host side decoder 434 may correct the Read Data as needed, e.g., when any bit error(s) is(are) detected. In block 850, the host side interface 430 may provide the Read Data to the memory controller 420. If the host side decoder 434 corrects the Read Data, the corrected Read Data may be provided to the memory controller 420.

While not specifically shown, the host 410 may communicate with multiple memory devices 450. It should be noted that not all blocks of the method 700 or the method 800 need be performed. Also, the blocks of the method 700 and/or the blocks of the method 800 need not be performed in any particular order.

Figure 9:
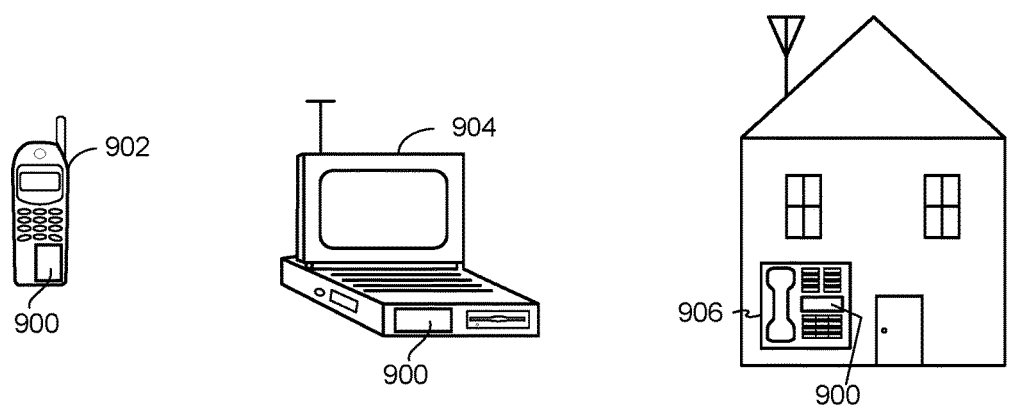
FIG. 9 illustrates examples of devices with a memory subsystem integrated therein.

FIG. 9 illustrates various electronic devices that may be integrated with the aforementioned memory subsystem 400. For example, a mobile phone device 902, a laptop computer device 904, a terminal device 906 as well as wearable devices, portable systems, that require small form factor, extreme low profile, may include a device/package 900 that incorporates the memory subsystem 400 as described herein. The device/package 900 may be, for example, any of the integrated circuits, dies, integrated devices, integrated device packages, integrated circuit devices, device packages, integrated circuit (IC) packages, package-on-package devices, system in package devices described herein. The devices 902, 904, 906 illustrated in FIG. 9 are merely exemplary. Other electronic devices may also feature the device/package 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

A non-exhaustive list of benefits of one or more aspects the proposed memory subsystem is as follows:

Improve reliability of applying data protection (e.g., ECC) to high speed memory link without memory bandwidth loss and cost impact;

No additional memory device is required;

Maintain low power memory pin count and package compatibility.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer-readable media embodying any of the devices described above. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. A memory device, comprising:
   a memory bank;
   a memory side interface configured to
      receive a WRITE command from a host over a link,
      receive Write Data and a write protection code from the host over the link,
      store the Write Data to the memory bank in response to the WRITE command,
      receive a READ command from the host over the link,
      retrieve Read Data from the memory bank in response to the READ command, and
      send the Read Data and a read protection code to the host over the link;
   a memory side decoder configured to detect whether the Write Data has an error based on the write protection code; and
   a memory side encoder configured to generate the read protection code based on the Read Data retrieved from the memory bank,
   wherein the link comprises a plurality of data (DQ) lines, a data mask (DM) line for use in mask write operations, and a Read Strobe clock line for use by the memory device to provide timing in read operations, and
   wherein the memory side interface is configured to
      receive the Write Data and send the Read Data over the plurality of DQ lines, receive the write protection code over the Read Strobe clock line, and send the read protection code over the DM line.

2. The memory device of claim 1, wherein the write protection code and/or the read protection code comprises a parity code.

3. The memory device of claim 1, wherein the memory side decoder is configured to correct the Write Data when the error is detected in the Write Data such that the memory side interface stores the corrected Write Data to the memory bank.

4. The memory device of claim 1, wherein the memory side interface is configured to receive DM data from the host over the DM line, and wherein the memory side decoder configured to detect whether the Write Data and/or the DM data has the error based on the write protection code.

5. The memory device of claim 1, wherein the memory side encoder is configured to generate the read protection code based on a zeroed out DM mask in addition to the Read Data.

6. The memory device of claim 1, wherein the memory side interface is configured to send the Read Data and the read protection code such that an end of transfer of the Read Data coincides with an end of transfer of the read protection code.

7. The memory device of claim 1, wherein one or both of the write protection code and the read protection code are error correction codes (ECC).

8. The memory device of claim 1, wherein the write protection code is not stored in the memory device.

9. The memory device of claim 1, wherein the memory device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

10. A host, comprising:

a memory controller configured to issue READ and WRITE commands;

a host side interface configured to send the WRITE command from the memory controller to a memory device over a link, send Write Data and a write protection code to the memory device over the link, send the READ command from the memory controller to the memory device over the link, subsequent to the READ command being sent, receive Read Data and a read protection code from the memory device over the link, and provide the Read Data to the memory controller;

a host side encoder configured to generate the write protection code based on the Write Data; and a host side decoder configured to detect whether the Read Data has an error based on the read protection code, wherein the link comprises a plurality of data (DQ) lines, a data mask (DM) line for use in mask write operations, and a Read Strobe clock line for use by the memory device to provide timing in read operations, and wherein the host side interface is configured to:

send the Write Data and receive the Read Data over the plurality of DQ lines, send the write protection code over the Read Strobe clock line, and receive the read protection code over the DM line.

11. The host of claim 10, wherein the write protection code and/or the read protection code comprises a parity code.

12. The host of claim 10, wherein the host side decoder is configured to correct the Read Data when the error is detected in the Read Data such that the host side interface provides the corrected Read Data to the memory controller.

13. The host of claim 10, wherein the host side interface is configured to send DM data to the memory device over the DM line, and wherein the host side encoder is configured to generate the write protection code based on the Write Data and the DM data.

14. The host of claim 10, wherein the read protection code received over the DM line is a code generated based on the Read Data and a zeroed out DM mask.

15. The host of claim 10, wherein the host side interface is configured to send the Write Data and the write protection code such that an end of transfer of the Write Data coincides with an end of transfer of the write protection code.

16. The host of claim 10, wherein one or both of the write protection code and the read protection code are error correction codes (ECC).

17. The host of claim 10, wherein the host is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *